(12) United States Patent
Janak et al.

(10) Patent No.: US 9,848,515 B1
(45) Date of Patent: Dec. 19, 2017

(54) MULTI-COMPARTMENT COMPUTING DEVICE WITH SHARED COOLING DEVICE

(71) Applicant: Advanced Micro Devices, Inc., Sunnyvale, CA (US)

(72) Inventors: Christopher Janak, Austin, TX (US); Steve Capezza, Austin, TX (US); Christopher M Jaggers, Austin, TX (US); David A McAfee, Austin, TX (US); Ali Akbar Merrikh, Austin, TX (US); Matthew Grossman, Austin, TX (US); Nicholas Poteracki, Austin, TX (US); Jefferson West, Austin, TX (US); Paul Hughes, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 15/166,563

(22) Filed: May 27, 2016

(51) Int. Cl.
*H05K 7/20* (2006.01)
*H05K 7/14* (2006.01)

(52) U.S. Cl.
CPC ....... *H05K 7/20781* (2013.01); *H05K 7/1488* (2013.01); *H05K 7/20736* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,777,847 A | 7/1998 | Tokuno et al. | |
| 5,812,860 A | 9/1998 | Horden et al. | |
| 5,930,115 A | 7/1999 | Tracy et al. | |
| 5,966,289 A | 10/1999 | Hastings et al. | |
| 5,978,223 A | 11/1999 | Hamilton et al. | |
| 6,141,762 A | 10/2000 | Nicol | |
| 6,185,481 B1 | 2/2001 | Kondou et al. | |
| 6,216,235 B1 | 4/2001 | Thomas | |
| 6,424,533 B1 | 7/2002 | Chu et al. | |
| 6,484,521 B2 | 11/2002 | Patel et al. | |
| 6,487,668 B2 | 11/2002 | Thomas | |
| 6,595,014 B2 | 7/2003 | Malone et al. | |
| 6,612,120 B2 | 9/2003 | Patel et al. | |

(Continued)

*Primary Examiner* — Anthony Haughton
*Assistant Examiner* — Razmeen Gafur
(74) *Attorney, Agent, or Firm* — Faegre Baker Daniels LLP (57) ABSTRACT

Various computing devices, thermal solutions and enclosures are disclosed. In one aspect, a computing device enclosure is provided that includes a first compartment that has a first upper side and is adapted to house the computing device and a liquid cooling device. The computing device has at least one heat generating component operable to transfer heat to the liquid cooling device. A second compartment has a lower side that includes an air inlet and a second upper side that has an air outlet. The second compartment is adapted to house a head exchanger to remove hear transferred to the liquid cooling device. A hub connects the first second compartment to the first compartment in spaced apart relation so as to leave a gap between the first upper side and the lower side.

33 Claims, 6 Drawing Sheets

(56) References Cited

U.S. PATENT DOCUMENTS

| | | |
|---|---|---|
| 6,614,109 B2 | 9/2003 | Cordes et al. |
| 6,650,542 B1 | 11/2003 | Chrysler et al. |
| 6,680,848 B2 | 1/2004 | Petit et al. |
| 6,817,196 B2 | 11/2004 | Malone et al. |
| 6,836,849 B2 | 12/2004 | Brock et al. |
| 6,880,345 B1 | 4/2005 | Leija et al. |
| 6,893,902 B2 | 5/2005 | Cordes et al. |
| 6,908,227 B2 | 6/2005 | Rusu et al. |
| 6,952,346 B2 | 10/2005 | Tilton et al. |
| 6,988,534 B2 | 1/2006 | Kenny et al. |
| 7,028,118 B2 | 4/2006 | Smith et al. |
| 7,043,405 B2 | 5/2006 | Orenstien et al. |
| 7,062,933 B2 | 6/2006 | Burns et al. |
| 7,075,261 B2 | 7/2006 | Burstein |
| 7,111,178 B2 | 9/2006 | Rusu et al. |
| 7,140,193 B2 | 11/2006 | Johnson et al. |
| 7,149,645 B2 | 12/2006 | Mangrulkar et al. |
| 7,191,349 B2 | 3/2007 | Kaushik et al. |
| 7,197,733 B2 | 3/2007 | Issa et al. |
| 7,249,268 B2 | 7/2007 | Bhandarkar |
| 7,263,457 B2 | 8/2007 | White et al. |
| 7,296,167 B1 | 11/2007 | Hughes |
| 7,336,487 B1 | 2/2008 | Chrysler et al. |
| 7,349,762 B2 | 3/2008 | Omizo et al. |
| 7,362,583 B2 | 4/2008 | Refai-Ahmed et al. |
| 7,369,404 B2 | 5/2008 | Han et al. |
| 7,369,409 B2 | 5/2008 | Yazawa |
| 7,395,174 B2 | 7/2008 | Aguilar, Jr. et al. |
| 7,421,601 B2 | 9/2008 | Bose et al. |
| 7,426,649 B2 | 9/2008 | Brittain et al. |
| 7,436,059 B1 | 10/2008 | Ouyang |
| 7,451,332 B2 | 11/2008 | Culbert et al. |
| 7,451,333 B2 | 11/2008 | Naveh et al. |
| 7,490,017 B2 | 2/2009 | Aguilar, Jr. et al. |
| 7,502,948 B2 | 3/2009 | Rotem et al. |
| 7,512,530 B2 | 3/2009 | Aguilar, Jr. et al. |
| 7,519,925 B2 | 4/2009 | Issa et al. |
| 7,549,177 B2 | 6/2009 | Diefenbaugh et al. |
| 7,552,340 B2 | 6/2009 | Ooi et al. |
| 7,568,115 B2 | 7/2009 | Borkar et al. |
| 7,577,860 B2 | 8/2009 | Carpenter et al. |
| 7,581,198 B2 | 8/2009 | Huynh et al. |
| 7,596,430 B2 | 9/2009 | Aguilar, Jr. et al. |
| 7,617,403 B2 | 11/2009 | Capps, Jr. et al. |
| 7,650,521 B2 | 1/2010 | Oikawa |
| 7,653,824 B2 | 1/2010 | Rangarajan et al. |
| 7,664,971 B2 | 2/2010 | Oh |
| 7,672,129 B1 | 3/2010 | Ouyang et al. |
| 7,690,214 B2 | 4/2010 | Lu et al. |
| 7,690,550 B2 | 4/2010 | Yokota |
| 7,742,299 B2 | 6/2010 | Sauciuc et al. |
| 7,774,626 B2 | 8/2010 | Fleming |
| 7,778,519 B2 | 8/2010 | Harville |
| 7,818,596 B2 | 10/2010 | Fenger et al. |
| 7,865,751 B2 | 1/2011 | Monferrer et al. |
| 7,875,986 B2 | 1/2011 | Isa et al. |
| 7,949,887 B2 | 5/2011 | Gunther et al. |
| 7,966,511 B2 | 6/2011 | Naveh et al. |
| 8,064,197 B2 | 11/2011 | Mowry et al. |
| 2002/0001176 A1* | 1/2002 | Shibasaki ............... G06F 1/203 361/679.52 |
| 2003/0110012 A1 | 6/2003 | Orenstien et al. |
| 2003/0189815 A1 | 10/2003 | Lee |
| 2004/0008475 A1* | 1/2004 | Ohashi ..................... F28F 1/22 361/679.53 |
| 2004/0070942 A1* | 4/2004 | Tomioka ................. G06F 1/203 361/700 |
| 2004/0080908 A1* | 4/2004 | Wang ....................... G06F 1/203 361/679.47 |
| 2005/0050373 A1 | 3/2005 | Orenstien et al. |
| 2005/0178814 A1 | 8/2005 | Yokota |
| 2005/0254209 A1 | 11/2005 | Lin |
| 2005/0276015 A1 | 12/2005 | Wong |
| 2006/0022710 A1 | 2/2006 | Chalopin et al. |
| 2006/0090161 A1 | 4/2006 | Bodas et al. |
| 2006/0095911 A1 | 5/2006 | Uemura |
| 2006/0095913 A1 | 5/2006 | Bodas et al. |
| 2006/0149974 A1 | 7/2006 | Rotem |
| 2006/0156117 A1 | 7/2006 | Maruyama |
| 2006/0161375 A1 | 7/2006 | Duberstein |
| 2006/0218424 A1 | 9/2006 | Abramovici |
| 2006/0265174 A1 | 11/2006 | Doyle |
| 2006/0288243 A1 | 12/2006 | Kim |
| 2007/0086157 A1* | 4/2007 | Ruch ....................... G06F 1/203 361/679.46 |
| 2007/0171613 A1 | 7/2007 | McMahan |
| 2007/0213882 A1 | 9/2007 | Inukai |
| 2007/0230120 A1* | 10/2007 | Hata ....................... G06F 1/1616 361/690 |
| 2007/0296475 A1 | 12/2007 | Oikawa |
| 2008/0005591 A1 | 1/2008 | Trautman |
| 2008/0028236 A1 | 1/2008 | Capps et al. |
| 2008/0028244 A1 | 1/2008 | Capps et al. |
| 2008/0074842 A1* | 3/2008 | Tracy ....................... G06F 1/203 361/695 |
| 2008/0174957 A1* | 7/2008 | Lev ......................... G06F 1/203 361/694 |
| 2008/0296000 A1 | 12/2008 | Lyon |
| 2008/0310099 A1 | 12/2008 | Monferrer |
| 2009/0072885 A1 | 3/2009 | Kawasaki |
| 2009/0138748 A1 | 5/2009 | Kim et al. |
| 2009/0153109 A1 | 6/2009 | Koertzen |
| 2009/0168331 A1* | 7/2009 | Fujiwara ................ G06F 1/203 361/679.47 |
| 2009/0235105 A1 | 9/2009 | Branover |
| 2009/0271646 A1 | 10/2009 | Talwar |
| 2009/0279258 A1* | 11/2009 | Moore ..................... G06F 1/203 361/699 |
| 2009/0288092 A1 | 11/2009 | Yamaoka |
| 2010/0031073 A1 | 2/2010 | Yeh |
| 2010/0058078 A1 | 3/2010 | Branover |
| 2010/0058086 A1 | 3/2010 | Lee |
| 2010/0064162 A1 | 3/2010 | Rotem |
| 2010/0073068 A1 | 3/2010 | Cho |
| 2010/0169609 A1 | 7/2010 | Finkelstein |
| 2010/0245179 A1 | 9/2010 | Puzella et al. |
| 2011/0038120 A1* | 2/2011 | Merz ................... G02F 1/133308 361/679.47 |
| 2011/0164384 A1* | 7/2011 | Vogel ....................... F28D 1/024 361/696 |
| 2012/0026677 A1* | 2/2012 | Bhutani ................ F04D 25/0613 361/679.48 |
| 2013/0021750 A1* | 1/2013 | Senatori .................. G06F 1/206 361/695 |
| 2013/0107455 A1* | 5/2013 | Cottet ................... H05K 7/20672 361/694 |
| 2013/0128464 A1* | 5/2013 | Chen ....................... H05K 7/026 361/721 |
| 2013/0141867 A1* | 6/2013 | Zhou ................... H05K 7/20909 361/691 |
| 2013/0301213 A1* | 11/2013 | Senyk ..................... G06F 1/203 361/679.47 |
| 2014/0078668 A1* | 3/2014 | Goulden ............... H05K 7/20736 361/679.47 |
| 2014/0254095 A1* | 9/2014 | Horng ....................... G06F 1/28 361/692 |
| 2014/0268570 A1* | 9/2014 | Crouch ................. H05K 7/20936 361/696 |
| 2015/0153792 A1* | 6/2015 | Chen ......................... G06F 1/20 361/679.47 |
| 2015/0181765 A1* | 6/2015 | Hsu ..................... H05K 7/20509 361/714 |
| 2015/0319885 A1* | 11/2015 | Uehara .................... F24F 1/18 361/700 |
| 2016/0174357 A1* | 6/2016 | Paine ....................... H01R 12/72 361/711 |

\* cited by examiner

MULTI-COMPARTMENT COMPUTING DEVICE WITH SHARED COOLING DEVICE

BACKGROUND OF THE DISCLOSURE

This invention relates generally to electronic devices, and more particularly to computing device enclosures and thermal management systems for computing devices.

Many types of conventional computers consist of a one or more circuit boards housed with an enclosure or case. ATX and microATX represent some conventional standard case sizes. A few conventional case designs incorporate two side-by side compartments or sometimes vertically stacked compartments. In many conventional designs, thermal management is provided by a heat sink or spreader and a cooling fan. However, some conventional computers generate more heat than can be adequately managed by air flow alone. These designs often resort to a liquid cooling system.

Several technical issues are presented by conventional liquid cooling and case designs. Many conventional liquid cooling systems employ multiple radiators. The placement of these multiple radiators is normally driven by whatever the prevailing standard enclosure form factors are, such as ATX/microATX, etc. These standard form factors do not allow the most efficient use of space. In addition, typical conventional liquid cooling systems using standard components tend to be relatively large and do not allow for much customization or implementation of unique form factors. Some conventional dual compartment computer cases tend to draw air passed first through, and thus preheated by, one compartment and into the second compartment that houses the liquid cooling radiators. This preheating reduces the efficacy of the radiator.

Many current liquid cooling computer systems encompass multiple cold plates which are mounted to various high power devices within the system. This leads to higher system complexity and size since these various cold plates must be routed together via a tubing network within the system. Typically, the cold plates must be interconnected and routed into a radiator for the heat to be removed from the system. Since each cold plate has one inlet and one outlet for the fluid, this requires more hardware and interconnection between each cold plate (tubing, fitting, etc.). These networks of cold plates are not optimized to fit within a system enclosure and therefore leads to wasted space and greater assembly complexity within the system enclosure.

The present invention is directed to overcoming or reducing the effects of one or more of the foregoing disadvantages, among others.

SUMMARY OF THE INVENTION

In accordance with one aspect of the present invention, a computing device enclosure is provided that includes a first compartment that has a first upper side and is adapted to house the computing device and a liquid cooling device. The computing device has at least one heat generating component operable to transfer heat to the liquid cooling device. A second compartment has a lower side that includes an air inlet and a second upper side that has an air outlet. The second compartment is adapted to house a heat exchanger to remove heat transferred to the liquid cooling device. A hub connects the second compartment to the first compartment in a spaced apart relation so as to leave a gap between the first upper side of the compartment and the lower side of the second compartment.

In accordance with one aspect of the present invention, a computing device enclosure is provided that includes a compartment with a first portion that is adapted to house the computing device and a liquid cooling device. The computing device may have at least one heat generating component operable to transfer heat to the liquid cooling device. The second portion of the compartment is adapted to house a heat exchanger to remove heat transferred to the liquid cooling device. The compartment may include air inlets and air outlets for venting around its perimeter. For example, the compartment may include air inlets and air outlets around its middle portion to allow for venting.

In accordance with another aspect of the present invention, a computing device is provided that includes a first compartment that has a first upper side and a first heat generating component positioned in the first compartment. A liquid cooling device is positioned in the first compartment and in thermal contact with the first heat generating component. In one example, the heat generating component may be a power supply, or a component of a power supply, such as a voltage regulator. A second compartment has a lower side that includes an air inlet and a second upper side including an air outlet. A hub connects the second compartment to the first compartment in spaced apart relation so as to leave a gap between the first upper side and the lower side. A heat exchanger is positioned in the second compartment and delivers cooling liquid to the liquid cooling device and is operable to exchange heat with air moving from the air inlet through the second compartment to the air outlet.

In accordance with another aspect of the present invention, a liquid cooling device for a computing device is provided that includes an internal chamber to permit cooling liquid to pass there through. The liquid cooling device may be in thermal contact with a first heat generating component of the computing device and a second heat generating component of the computing device. For example, the liquid cooling device may be in thermal contact with a component of a power supply. In one example, the liquid cooling device may include a first side adapted to thermally contact a first heating generating component of the computing device, and a second side adapted to thermally contact a second heat generating component of the computing device.

In accordance with another aspect of the present invention, a computing device is provided that includes a first compartment that has a first upper side. A first circuit board is positioned in the first compartment and has a first heat generating component. A second circuit board is positioned in the first compartment in vertical spaced apart relation to the first circuit board and has a second heat generating component. A liquid cooling plate is positioned in the first compartment and includes a first portion in thermal contact with the first heat generating component and a second portion in thermal contact with the second heat generating component. In one example, the liquid cooling plate has a first side in thermal contact with the first heat generating component and a second side in thermal contact with the second heat generating component. A second compartment has a lower side that includes an air inlet and a second upper side that includes an air outlet. A hub connects the second compartment to the first compartment in spaced apart relation so as to leave a gap between the first upper side and the lower side.

In accordance with another aspect of the present invention, a method of manufacturing a computing device enclosure is provided that includes fabricating a first compartment having a first upper side and being adapted to house the computing device and a liquid cooling device. The computing device has at least one heat generating component operable to transfer heat to the liquid cooling device. A second compartment is fabricated that has a lower side that includes an air inlet and a second upper side that includes an air outlet. The second compartment is adapted to house a heat exchanger to remove heat transferred to the liquid cooling device. The second compartment is connected to the first compartment in spaced apart relation so as to leave a gap between the first upper side and the lower side.

In accordance with another aspect of the present invention, a method of thermally managing a computing device that has a first heat generating component is provided. The method includes placing the first heat generating component in a first compartment of an enclosure. The first compartment has a first upper side. The enclosure includes a second compartment with a second upper side and a lower side and is connected in spaced apart relation to the first compartment by a hub so as to leave a gap between the first upper side and the lower side. A liquid cooling device is placed in the first compartment and is in thermal contact with the first heat generating component.

BRIEF DESCRIPTION OF THE DRAWINGS

The foregoing and other advantages of the invention will become apparent upon reading the following detailed description and upon reference to the drawings in which.

DETAILED DESCRIPTION OF THE PREFERRED EMBODIMENTS

Various embodiments of a computing device and enclosure are disclosed. In one arrangement, the computing device is positioned in a lower compartment of a multi-compartment enclosure along with a liquid cooling device, such as a cooling plate(s). The cooling plate may be in thermal contact with one more heat generating components of the computing device. A heat exchanger and liquid pump may be positioned in a second, upper compartment of the enclosure. The first and second compartments are connected in vertical spaced apart elation by a hub so as to leave a gap between the lower and upper compartments. The hub includes an internal bore to accommodate liquid flow lines. The arrangement flows air through the upper compartment past a heat exchanger, but with little if any pre-heating from the lower compartment. Additional details will now be described.

Figure 1:
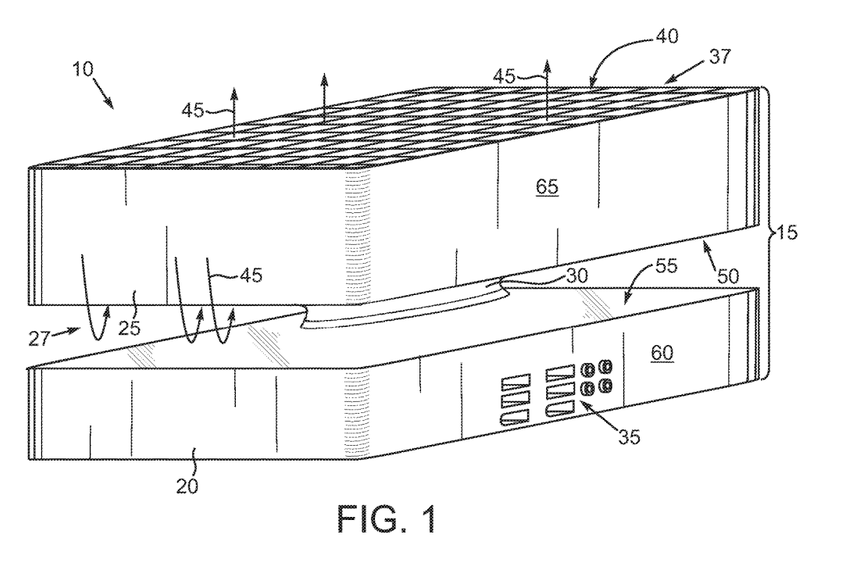
FIG. 1 is a pictorial view of an exemplary computing device that includes a multi-compartment enclosure.
Figure 2:
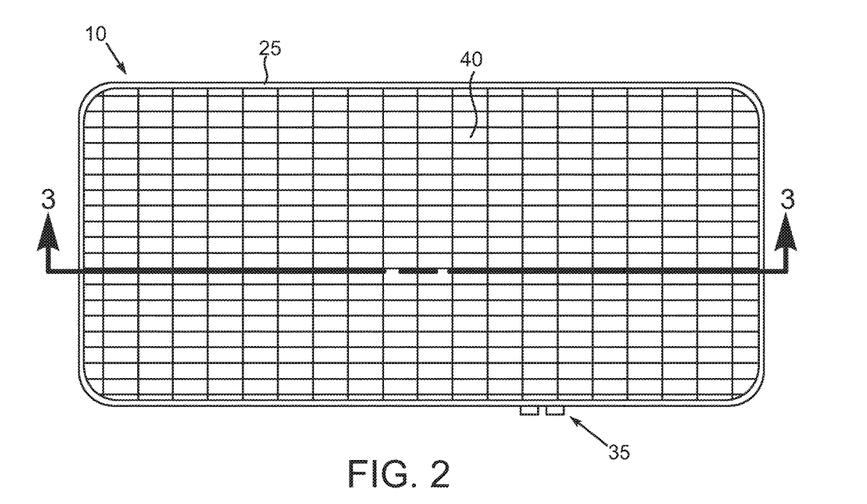
FIG. 2 is an overhead view of the exemplary computing device shown in FIG. 1.

In the drawings described below, reference numerals are generally repeated where identical elements appear in more than one figure. Turning now to the drawings, and in particular to FIGS. 1 and 2, therein are shown a pictorial view and an overhead view of an exemplary embodiment of a computing device 10 that includes a housing 15 that encloses various electronics and cooling devices (not shown) that will be described in more detail below and shown in subsequent figures. The housing 15 may be subdivided into a lower compartment 20 and an upper compartment 25 connected together, but vertically displaced to establish a gap 27. The lower compartment 20 and the upper compartment 25 may be connected by way of a hub 30. As described in more detail below, the lower compartment 20 may enclose a variety of different types of electronic components. Accordingly, the lower compartment 20 may be populated with plural input/output ports collectively labeled 35. The ports 35 may be video ports, data ports, audio ports, combinations of these or other types of ports as desired. In this illustrative embodiment, the upper side 37 of the upper compartment 25 may be configured with an air outlet 40 in the form of the grid or mesh-like design depicted that permits the discharge of cooling air 45. The air outlet 40 may have a rectangular mesh as shown, a diamond-shaped mesh or many other types of shapes and configurations. As shown in subsequent figures, a lower side 50 of the upper compartment 25 may similarly include a structure such as a grid or mesh to provide intake air. An upper side 55 of the lower compartment 20 may be a top wall that does not include capability for air flow. However, as described in alternate embodiments below, the upper side 55 may also incorporate air flow passages.

The gap 27 and the closed upper side 55 permit air 45 to be drawn into the gap 27, passed through the upper compartment 25 and discharged from the outlet 40 without first undergoing a preheating process, as is common in many conventional multi-compartment case designs. As better seen in FIG. 2, both the upper and lower compartments 20 and 25 may have a generally rectangular footprint. However, these footprints may be square, or other shapes as desired. Similarly, while in this illustrative embodiment the sidewalls 60 of the lower compartment 20 and the sidewalls 65 of the upper compartment 25 may be substantially vertical, in alternate embodiments the sidewalls 60 and 65 may be inwardly sloped, outwardly sloped or some other configuration as desired.

A variety of materials may be used to fabricate the lower compartment 20, the upper compartment 25 and the hub 30. Exemplary materials include, for example, aluminum, plastics, stainless steel, copper, combinations of these or others. The components of the upper and lower compartments 20 and 25 may be manufactured using casting, stamping, forging, molding, machining or other well-known fabrication techniques.

Figure 3:
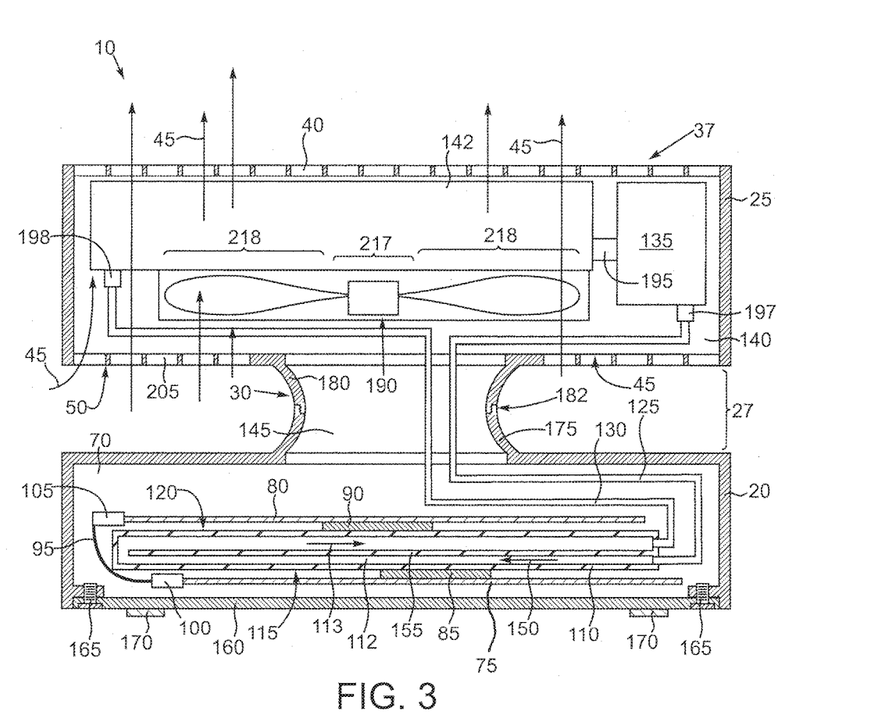
FIG. 3 is a sectional view of FIG. 2 taken at section 3-3.

Attention is now turned also to FIG. 3, which is a sectional view of FIG. 2 taken at section 3-3. As shown in FIG. 3, the lower compartment 20 may include an interior chamber 70 that may house a variety of components. For example, a circuit board 75 and another circuit board 80 may be positioned in the enclosure 70 and held in position by suitable posts, fasteners or other structures that are not visible. The circuit board 75 may be any variety of different types of electronic boards. The same is true for the circuit board 80. The circuit board 75 may include a variety of heat generating components, one of which is visible and labeled 85 and the circuit 25 board 80 may similarly include a variety of heat gene components, one of which is shown and labeled 90. The heat generating components 85 and 90 may be any of a variety of different types of electrical or electronic devices, such as, microprocessors, graphics processors, combined microprocessor/graphics processors sometimes known as application processing units, application specific integrated circuits, memory devices, systems on a chip, optical devices, passive components, interposers, or other devices. In an exemplary embodiment, one or more of the heat generating components 85 and 90 may be processors, such as an accelerated processing unit (APU), a central processing unit (CPU), a digital signal processor (DSP), or any other processor. The disclosed circuit boards, such as circuit board 75 and the circuit board 80 may be electrically connected to each other in a variety of ways. In this illustrative embodiment, the circuit boards 75 and 80 may be electrically connected by way of the disclosed flex connector 95 and respective flex terminals 100 and 105 on the circuit boards 75 and 80, respectively. Optionally, a myriad of other types of electrical connection schemes may be used to interconnect the circuit boards 75 and 80.

Thermal management for the heat generating components 85 and 90 may be provided by a liquid cooling device 110. The term "liquid" used herein is not intended to exclude the possibility of two phase flow. The liquid cooling device 110 may take on a variety of configurations. In an exemplary embodiment, the liquid cooling device 110 may be a cooling plate with an internal chamber 112 to permit flow of a cooling liquid 113, such as water, glycol or any other suitable coolant, such as a gas coolant. This internal chamber 112 is unitary in this embodiment, but may be shared among multiple chambers as discussed with other embodiments. The liquid cooling device 110 is advantageously designed to provide a shared liquid cooling capability for the heat generating components 85 and 90. In this illustrative embodiment, the heat generating component 85 is in thermal contact with a lower side 115 of the liquid cooling device 110 and the heat generating component 90 is positioned in opposition to the heat generating component 85 and thus in thermal contact with an upper side 120 of the liquid cooling device 110. This thermal contact may be facilitated by way of thermal greases or other thermal interface materials as desired. The liquid cooling device 110 is connected to a fluid supply line 125 and a fluid discharge line 130. The fluid supply line 125 is operable to deliver cooling liquid from a pump 135 that is positioned in an interior chamber 140 of the upper compartment 25. The fluid discharge line 130 is connected and operable to deliver cooling liquid from the liquid cooling device 110 to a heat exchanger 142 in the upper compartment 25. The fluid supply line 125 and the fluid discharge line 130 are routed through the hub 30 and more specifically through the open internal bore 145 of the hub 30.

The liquid cooling device 110 may be provided with a variety of different types of internal structures to facilitate the transfer of heat from the cooling liquid, one schematically depicted and labeled 150. For example, a single baffle wall 155 is illustrated, however as just noted, there can be multiple types of the internal structures to increase the surface area contact with the cooling liquid 150. The liquid cooling device 110 and any disclosed alternatives may be constructed of well-known materials, such as aluminum, copper, stainless steel, combinations or other materials, and using well-known techniques, such as casting, machining, punching, forging, soldering, welding, combinations of these or others.

Access to the chamber 70 of the lower compartment 20 may be provided in a variety of ways. In the illustrated embodiment, a removable lower panel 160 may be connected to the lower compartment 20 by way of multiple fasteners for screws 165. A variety of other techniques may be used to secure the hatch or panel 160 to the lower compartment 20. The lower hatch 160 may be provided with plural foot pads 170 to provide a cushioned support for the computing device 10 when seated on a surface (not shown). The pads 170 may number three of more.

The hub 30 may consist of mating halves 175 and 180 that may be joined at a threaded joint 185 or other type of joint as desired. The position of the joint 185 and thus the vertical extent of either or both of the mating halves 175 and 180 may be varied as desired. Here, the mating halves 175 and 180 may be integrally formed with the lower compartment 20 and the upper compartment 25, respectively. However, this need not be the case and thus the components of the hub 30 may be separately fabricated and thereafter attached to the lower compartment 20 and the upper compartment 25, respectively. While hub 30 is depicted as being round, other shapes could be used.

The structure and function of the upper compartment 25 will now be described in conjunction with FIG. 3. Additional components of the liquid cooling system may be housed in the internal chamber 140 and include, for example, the aforementioned liquid pump 135 as well as the heat exchanger 142 and a cooling fan 190. The heat exchanger 142 may be configured as a radiator or otherwise. The liquid pump 135, the liquid cooling device 110 and the heat exchanger 142 form a fluid circuit. In this regard, liquid pump 135 is connected to, and receives cooled liquid from, the heat exchanger 142 by way of a supply line 195. The liquid pump 135 delivers the cooling liquid to the liquid cooling device 110 and away therefrom and to the heat exchanger 142 by way of the supply line 125 and the discharge line 130, respectively. The supply line 125 may connect to the liquid pump 135 by way of a coupling 197, which may be a threaded coupling, soldered coupling or other types of fastening techniques and couplings. The discharge line 130 may be similarly connected to the heat exchanger 142 by a coupling 198. The same types of connections (schematically shown) may be used for other portions of the supply line 125 and discharge line 130 and the supply line 195. The heat exchanger 142 is schematically depicted but may consist of well-known structures used in radiator designs such as plural fins interspersed with multiple flow and discharge lines.

As noted briefly above, the underside 50 of the upper compartment 25 may be provided with an air inlet 205 in the form of the disclosed mesh structure, which may be substantially like the mesh structure or alternatives thereto of the upper compartment 25 described above and shown in FIGS. 1 and 2. In this way, when the fan 190 is operating, cooling air 45 may be drawn into the gap 27, up through the air inlet 205, past surfaces of the heat exchanger 142 and discharged out of the air outlet 40 at the upper side 37 of the upper compartment 25. The air 45 is not moved through the lower compartment 20 where it would be heated prior to movement into and through the upper compartment 25. The fan 190 may have a hub portion 217 and a blade portion 218. The heat exchanger 142 and the fan 190 are positioned in the upper compartment 25 such that the hub portion 217 is somewhat in vertical alignment with the hub 30. With this arrangement, very little preheated air is drawn up through the inlet 205 prior to contacting the heat exchanger 142. This is in contrast to many conventional dual compartment computer cases where cooling air delivered to a water cooling system is delivered from the confines of an enclosure that includes heat generating components which tends to preheat that intake air that passes over the liquid cooling system.

In the foregoing illustrative embodiment depicted in FIG. 3, the liquid cooling device 110 is sandwiched between the heat generating components 85 and 90 and thus uses opposite sides 115 and 120 to establish thermal contact with those components. However, other arrangements are envisioned. In this regard, attention is now turned to FIG. 4, which is a sectional view like FIG. 3 but of an alternate exemplary embodiment of a computing device 10'. The computing device 10' may share many attributes with the computing device 10 described above. Thus, the computing device 10' may include the aforementioned lower compartment 20 and upper compartment 25 as well as the hub 30. Like the other illustrative embodiments, the upper compartment 25 may include the heat exchanger 142, the cooling fan 190, and the liquid pump 135, all of which are used to provide thermal management by drawing cooling air 45 through the air inlet 205 and discharged out the air outlet 40. Similarly, the liquid pump 135 is connected to a supply line 125 and a discharge line 130. However, a liquid cooling device 110' utilized to provide thermal management for heat generating components within the lower compartment 20 has a different configuration than the above described embodiment. In this illustrative embodiment, a heat generating component 85 may be connected to a circuit board 220 and a heat generating component 90 may be connected to a circuit board 225. The heat generating components 85 and 90 may be configured as described above in conjunction with the components 85 and 90. The circuit board 220 may be connected electrically to the circuit board 225 by way of a riser connector 230 which may be configured like any of a variety of well-known riser connectors. In this illustrative embodiment, and because the riser connector 230 is utilized, the heat generating component 85 faces upward and is at a lower elevation then the heat generating component 90 which is facing downward. To provide thermal management for these heat generating components 85' and 90' that are spatially oriented as shown, the liquid cooling device 110' may include an upper cooling plate 235 and a lower cooling plate 240 that is in fluid communication with the upper cooling plate 235. The upper cooling plate 235 includes a body 242 and a lid 243 that may be detachably connected to the body 242. The body 242 and the lid 243 enclose an internal chamber 244. The usage of a lid 243 facilitates the formation, by casting, machining or otherwise, of various internal passages and reservoirs to be described below. The lid 243 may be secured to the body 242 by soldering, adhesives, screws, welds or other fastening techniques. The body 242 may include a block 245, which projects downwardly to establish thermal contact with the heat generated component 85'. The block 245 includes a chilled liquid inlet reservoir 250. The lower cooling plate 240 similarly may include a body 252 and a lid 253 that enclose an internal chamber 254 and function and may be constructed like the body 242 and lid 243. The internal chambers 244 and 254 function as a shared internal chamber since they are in fluid communication.

Figure 4:
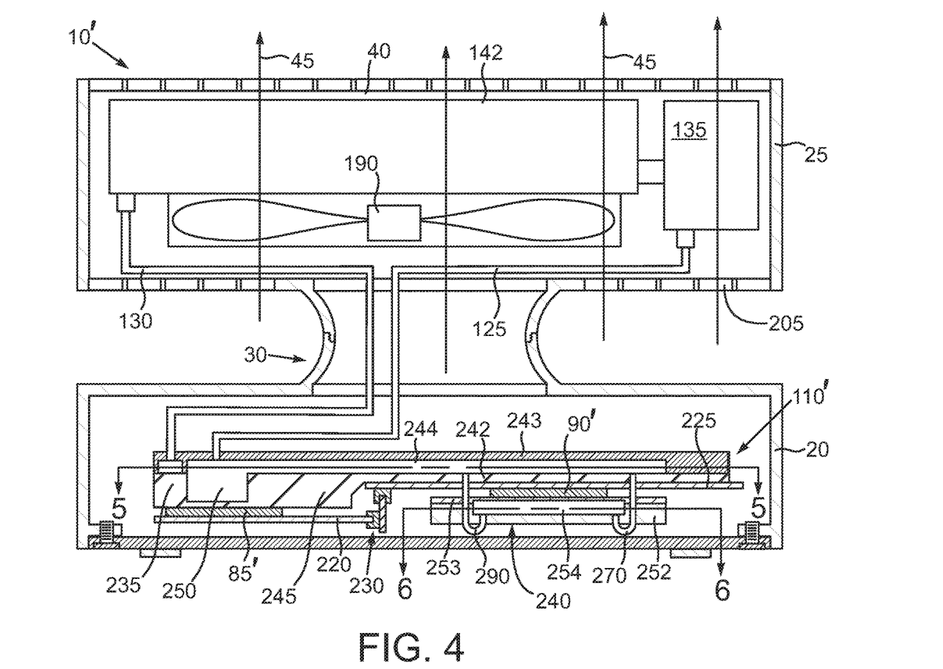
FIG. 4 is a sectional vie like FIG. 3, but of an alternate exemplary computing device that includes a multi-compartment enclosure.
Figure 5:
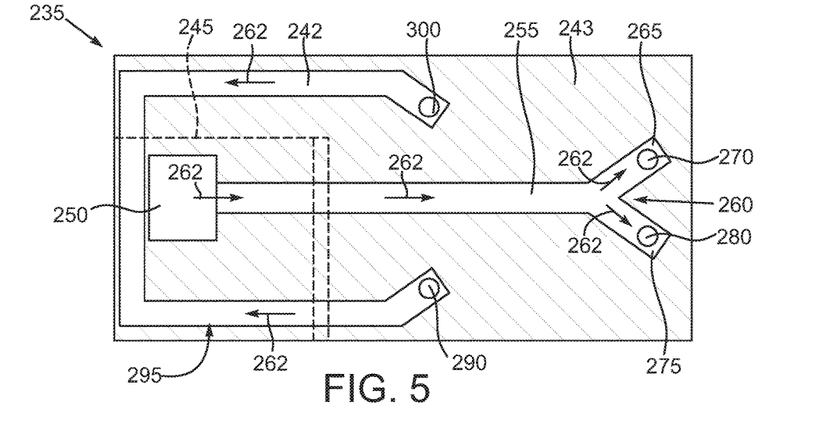
FIG. 5 is a sectional view of FIG. 4 taken at section 5-5.

Additional details of the upper cooling plate 235 may be understood by referring to FIG. 5, which is a sectional view of FIG. 4 taken at section 5-5. Note that because of the location of section 5-5, the lid 243 is shown in section while the underlying body 242 is not. The chilled liquid inlet reservoir 250 is in fluid communication with the fluid supply line 125 that is connected to the liquid pump 135. Chilled liquid delivered to the reservoir 250 then passes into a longitudinal channel 255 that terminates at a Y-branch 260. Liquid flow is represented by the arrows 262. One branch 265 of the Y-branch 260 terminates in a fluid passage 270 and the other branch 275 terminates in another fluid passage 280. The fluid passage 270 is shown and labeled also in FIG. 4 but it should be understood that the fluid passage 270 is shown out of rotation in FIG. 4 so that it can be seen in the sectional view that is FIG. 4. The fluid passages 270 and 280 deliver chilled liquid down through suitable openings in the circuit board 225 that are not separately labeled. The chilled liquid passes through the body of the cooling plate 240 and loops back up in a J-shape or otherwise fashion to the internal chamber 254 of the lower cooling plate 240. After passing through and contacting various features inside the internal chamber 254, the liquid passes out of the chamber 254 down into a fluid passage that may be configured like the fluid passages 270 and 280 that feed up through the cooling plate 240 through suitable openings in the circuit board 225 and ultimately terminating in a U-shaped channel 290 in the lid 243 of the upper cooling plate 235 as best seen in FIG. 5. Again it should be noted that the fluid pipe or passage 290 shown in FIG. 4 is shown out of rotation in FIG. 4. Ultimately the U-shaped channel 295 is in fluid communication with the fluid discharge line 130 that leads back to the liquid pump 135. In this way, the chilled liquid at its lower temperature may be delivered to the upper cooling plate 235 and ultimately to the block 245, which is shown in dashed lines in FIG. 5 such that, if the heat generating component 85' dissipates a greater amount of heat than the heat generating component 90, the lower temperature liquid can be delivered first to the heat generating component 85 and thereafter passed through from the upper cooling plate 235 to the lower cooling plate 240 to deliver still effective cooling liquid but at a subsequently higher temperature to the heat generating component 90. Note that the block 245 not only provides the capability to deal with elevation differences between heat generating components 85 and 90 but also provides a greater physical mass in order to transfer heat away from the heat generating component 85 and to facilitate heat transfer with a cooling fluid. The upper and lower cooling plates 235 and 240 may be constructed of a variety of materials, such as copper, aluminum, stainless steel, combinations of these or other materials.

Figure 6:
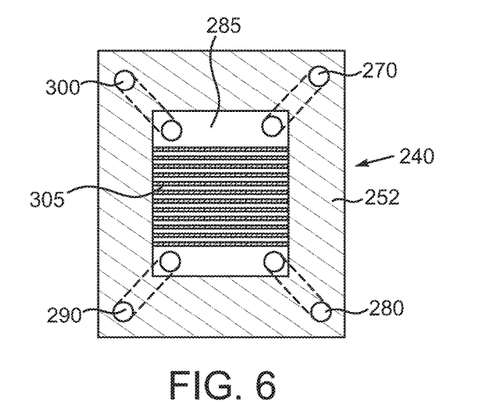
FIG. 6 is a sectional view of FIG. 4 taken at section 6-6.

Additional details of the lower cooling plate 240 may be understood by referring now also to FIG. 6, which is a sectional view of FIG. 4 taken at section 6-6. Note that because of the location of section 6-6, the body 252 is shown in section and the lid 253 is not visible. Here, the body 252 of the lower cooling plate 240 is shown in section to reveal also the internal chamber 285. The fluid passages or tubes 270 and 290 that appear as J-shaped tubes in FIG. 4 appear as circles and phantom lines in FIG. 6, as do the J-shaped tubes 280 and 300, due to the location of section 6-6. Note that the internal chamber 285 may be provided with plural baffles or other textured surfaces 305 to simply provide a greater surface area for heat transfer with the cooling fluid. The number arrangement of such baffles 305 may be subject to great variety.

Figure 7:
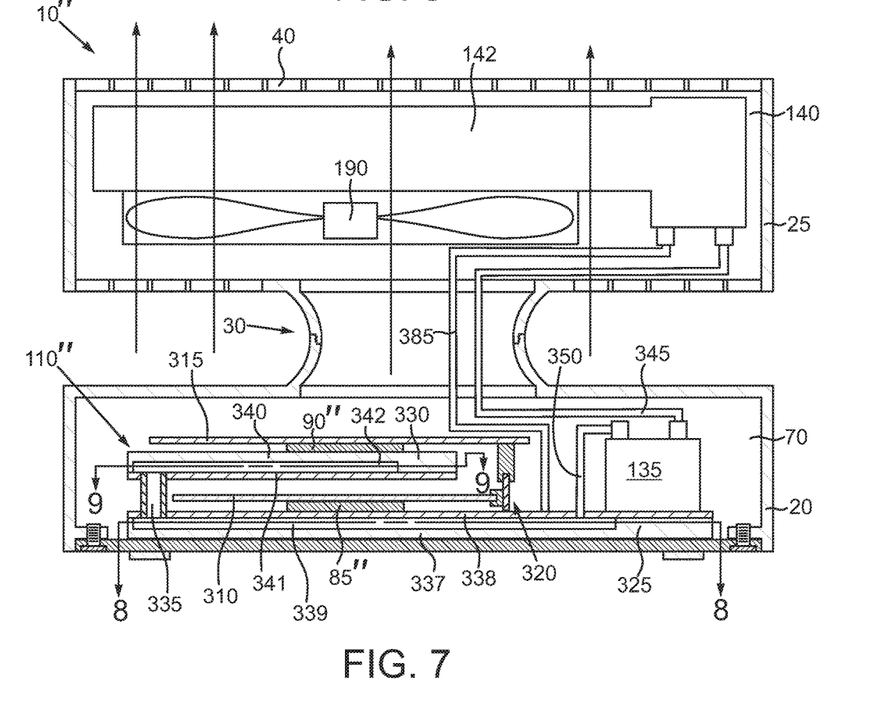
FIG. 7 is a sectional view like FIG. 3, but of another alternate exemplary computing device that includes a multi-compartment enclosure.

Another alternate embodiment of a computing device 10" may be understood by referring now to FIG. 7, which is a sectional view like FIG. 3. The computing device 10" may share many attributes with the other disclosed embodiments, such as the lower compartment 20, the upper compartment 25, the hub 30, the heat exchanger 142 and the cooling fan 190 both positioned in the internal chamber 140 of the upper compartment 25. However, the lower compartment 20 may house a different configuration of electronic components that may benefit from an alternative configuration of heat exchangers. In this illustrative embodiment, a heat generating component 85" may be connected to a circuit board 310 and a heat generating component 90" may be connected to a circuit board 315. In this illustrative embodiment, the heat generating component 90" faces downward and so does the heat generating component 85". The circuit board 310 may be electrically connected to the circuit board 315 by way of a riser connection 320 which may be configured like the riser connection 230 described above. To provide thermal management for the heat generating components 850 and 900, a liquid cooling device 110" may include a lower cooling plate 325 and an upper cooling plate 330. The upper cooling plate 330 is in fluid communication with the lower cooling plate 325 by way of one or more fluid passages, one of which is visible in FIG. 7 and labeled 335. Note that the passage 335 is shown out of rotation in FIG. 7 and will be more evident during the description of FIG. 9 to follow. The lower cooling plate 325 may include a body 337 and lid 338 connected to the body 337 that together enclose an internal chamber 339. The upper cooling plate 330 may similarly include a body 340 and a lid 341 connected to the body 340 that together enclose an internal chamber 342. The bodies 337 and 340 and the lids 338 and 341 may function and be constructed like the other body and lid alternatives disclosed herein. Thus, the internal chambers 339 and 342 function as a shared internal chamber since they are in fluid communication. In this illustrative embodiment, the liquid pump 135 may be positioned in the internal chamber 70 of the lower compartment 20.

Figure 8:
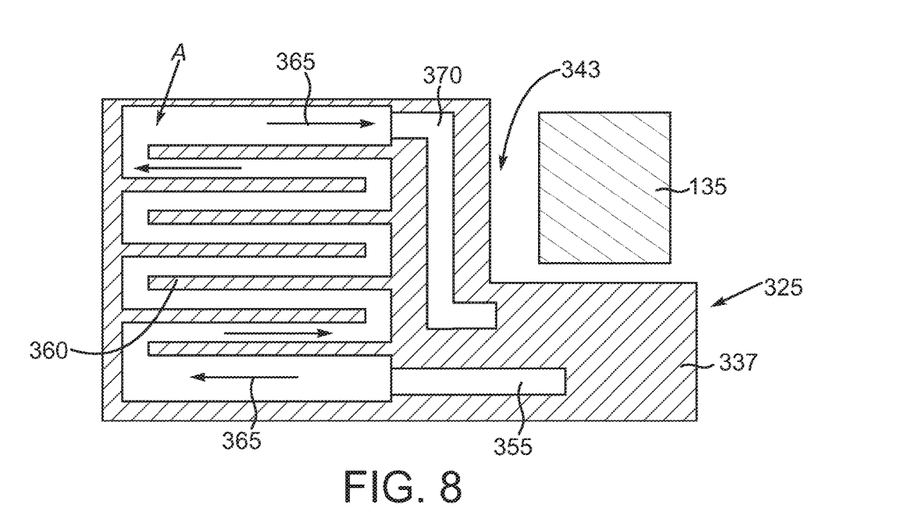
FIG. 8 is a sectional view of FIG. 7 taken at section 8-8.

Additional details of the lower cooling plate 325 may be understood by referring now also to FIG. 8, which is a sectional view of FIG. 7 taken at section 8-8. Because of the location of section 8-8, the body 337 of the lower cooling plate 325 and the liquid pump 135 are shown in section but the lid 338 is not visible. Note that the body 337 of the lower cooling plate 325 may include a cutout 343 to accommodate the placement of the pump 135. As shown in FIG. 7, the pump 135 may include a chilled liquid intake line 345 which is connected to the heat exchanger 142 and receives chilled liquid therefrom. In addition, the pump includes a chilled liquid delivery line 350 that is connected to the lower cooling plate 325. That connection between the chilled liquid supply line 350 and the lower cooling plate 325 may occur at a channel 355 in the lower cooling plate 325 that is shown in FIG. 8. Fluid may flow through the channel 355 around a plurality of baffles 360, as indicated by the arrows 365, and ultimately flow across the width of the cooling plate 325 and into a return channel 370. The location A of the channel 355 may be a position where liquid from the upper cooling plate 330 is returned to the lower cooling plate 325 as described below in conjunction with FIG. 9. The return channel 370 is in fluid communication with a heated water delivery line 385 shown in FIG. 7 that is connected to the heat exchanger 142. Simultaneously, cooling liquid flows from the channel 355 up through the conduit 335 and into the upper cooling plate 330.

Figure 9:
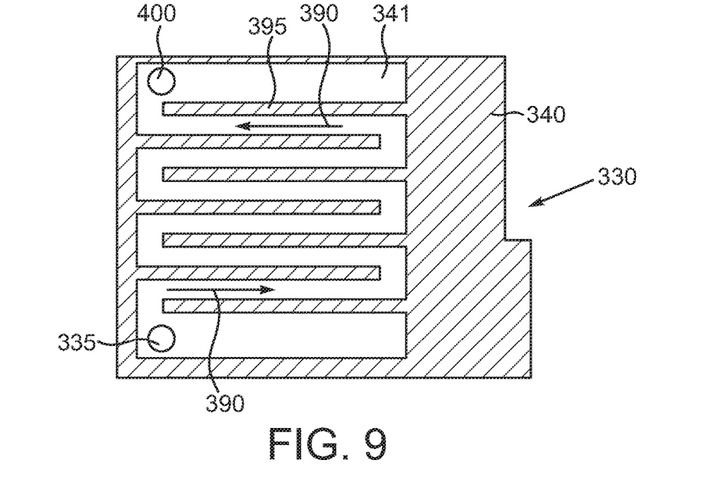
FIG. 9 is a sectional view of FIG. 7 taken at section 9-9.

Additional details of the upper cooling plate 330 may be better understood by referring now also to FIG. 9, which is a sectional view of FIG. 7 taken at 9-9. Because of the location of section 9-9, the body 340 is shown in section but the underlying lid 341 is partially visible and not in section. As just noted, a cooling fluid travels from the lower cooling plate 325 up through the conduit 335 and into the upper cooling plate 330 and follows a path indicated by the arrows 390 around a set of baffles 395 and ultimately discharges through a conduit 400, which may be like the conduit 335 that feeds down into the channel 355 at or around the location A of the lower cooling plate 325 shown in FIG. 8 where it ultimately may be transferred back to the heat exchanger 142. Of course the number and configuration of the baffles 395 may be subject to great variety.

Figure 10:
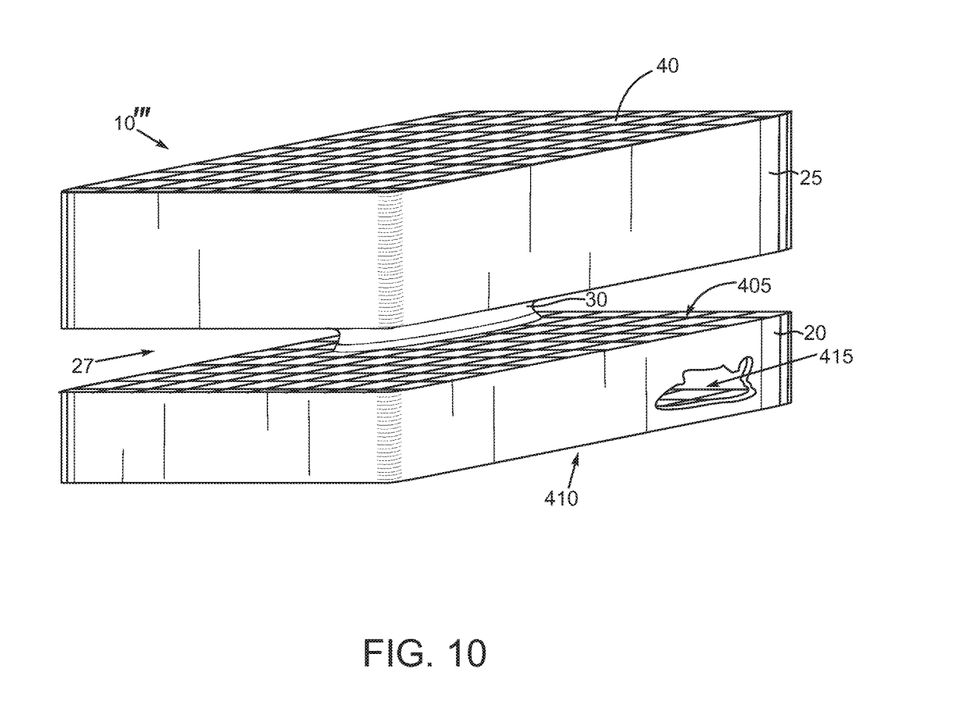
FIG. 10 is a pictorial view of another exemplary computing device that includes a multi-compartment enclosure.

In the foregoing illustrative embodiments of the computing devices 10, 10' and 10", the lower compartment 20 generally does not include any type of air inlets or air discharge openings while the upper compartment 25 does. However, and as shown in FIG. 10, an alternate exemplary computing device 10 may include a lower compartment 20, an upper compartment gap 27 and a hub 30 as generally described above. However, the lower compartment 20 may include an air inlet/discharge structure 405 such as the depicted mesh or alternatives disclosed elsewhere herein, and the upper compartment 25 may include the aforementioned air outlet 40 as described above. A portion of the lower compartment 20 is cut away to show that an underside 410 of the lower compartment 20 may also include an air inlet 415 in the form of the depicted mesh or alternatives disclosed elsewhere herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A computing device enclosure, comprising:
    a first compartment having a first upper side and being adapted to house the computing device and a liquid cooling device, the computing device having at least one heat generating component operable to transfer heat to the liquid cooling device;
    a second compartment having a lower side including an air inlet and a second upper side including an air outlet, the second compartment being adapted to house a heat exchanger to remove heat transferred to the liquid cooling device; and
    a hub connecting the second compartment to the first compartment in a spaced apart relation so as to leave a gap between the first compartment and the second compartment with the first upper side of the first compartment facing the lower side of the second compartment.

2. The computing device enclosure of claim 1, wherein the hub includes an internal bore to accommodate at least one coolant line.

3. The computing device enclosure of claim 1, wherein the air inlet comprise plural openings positioned around the hub.

4. The computing device enclosure of claim 3, wherein the air outlet comprises plural openings spanning at least a portion of the second upper side.

5. The computing device enclosure of claim 1, wherein the hub comprises a first half coupled to the first compartment and a second half coupled to the first half and to the second compartment.

6. The computing device enclosure of claim 1, comprising a fan positioned in the second compartment and having a hub region and a blade region, the fan being positioned so that the hub region is substantially aligned with the hub.

7. A computing device, comprising:
    a first compartment having a first upper side;
    a first heat generating component positioned in the first compartment;

a liquid cooling device positioned in the first compartment and in thermal contact with the first heat generating component;

a second compartment having a lower side including an air inlet and a second upper side including an air outlet;

a hub connecting the second compartment to the first compartment in spaced apart relation so as to leave a gap between the first compartment and the second compartment with the first upper side of the first compartment facing the lower side of the second compartment; and a heat exchanger positioned in the second compartment and in fluid communication with the liquid cooling device via at least one liquid supply line and at least one liquid discharge line and being operable to exchange heat with air moving from the air inlet through the second compartment to the air outlet.

8. The computing device of claim 1, wherein the first upper side of the first compartment is without air flow passages to limit preheating from the first compartment of airflow entering the air inlet of the second compartment.

9. The computing device of claim 7, comprising a fan positioned in the second compartment and having a hub region and a blade region, the fan being positioned so that the hub region is substantially aligned with the hub.

10. The computing device of claim 7, wherein the hub includes an internal bore to accommodate the at least one liquid supply line and at least one liquid discharge line.

11. The computing device of claim 7, wherein the air inlet comprise plural openings positioned around the hub.

12. The computing device of claim 11, wherein the air outlet comprises plural openings spanning at least a portion of the second upper side.

13. The computing device of claim 7, wherein the hub comprises a first half coupled to the first compartment and a second half coupled to the first half and to the second compartment.

14. The computing device of claim 7, wherein the first upper side of the first compartment is without air flow passages to limit preheating from the first compartment of airflow entering the air inlet of the second compartment.

15. A liquid cooling device for a computing device, comprising:

an internal chamber to permit cooling liquid to pass there through;

a first surface adapted to thermally contact a first heat generating component of the computing device; and a second surface adapted to thermally contact a second heat generating component of the computing device, wherein the second surface opposes the first surface of the liquid cooling device.

16. The liquid cooling device of claim 15, wherein the liquid cooling device comprises a single cooling plate including the first surface and the second surface that opposes the first surface.

17. The liquid cooling device of claim 15, wherein the liquid cooling device comprises a first cooling plate forming the first surface and the second surface and a second cooling plate in fluid communication with the first cooling plate so that the internal chamber is divided between the first cooling plate and the second cooling plate.

18. The liquid cooling device of claim 17, wherein the first cooling plate is adapted to be positioned above the second heat generating component and the second cooling plate is adapted to be positioned below the second heat generating component.

19. A computing device, comprising:

a first compartment having a first upper side;

a first circuit board positioned in the first compartment and having a first heat generating component;

a second circuit board positioned in the first compartment in vertical spaced apart relation to the first circuit board and having a second heat generating component;

a liquid cooling device positioned in the first compartment between the first circuit board and the second circuit board, the liquid cooling device including a first surface in thermal contact with the first heat generating component and a second surface in thermal contact with the second heat generating component, wherein the second surface opposes the first surface of the liquid cooling device;

a second compartment having a lower side including an air inlet and a second upper side including an air outlet;

a hub connecting the second compartment to the first compartment in spaced apart relation so as to leave a gap between the first upper side and the lower side.

20. The computing device of claim 19, comprising a heat exchanger positioned in the second compartment and in fluid communication with the liquid cooling device and being operable to exchange heat with air moving from the air inlet through the second compartment to the air outlet.

21. The computing device of claim 19, wherein the liquid cooling device comprises a first cooling plate forming the first surface and the second surface and a second cooling plate in fluid communication with the first cooling plate so that the internal chamber is divided between the first cooling plate and the second cooling plate.

22. The computing device of claim 21, wherein the first cooling plate is positioned above the second heat generating component and the second cooling plate is positioned below the second heat generating component.

23. A method of manufacturing a computing device enclosure, comprising:

fabricating a first compartment having a first upper side and being adapted to house the computing device and a liquid cooling device, the computing device having at least one heat generating component operable to transfer heat to the liquid cooling device;

fabricating a second compartment having a lower side including an air inlet and a second upper side including an air outlet, the second compartment being adapted to house a heat exchanger to remove heat transferred to the liquid cooling device; and connecting the first compartment to the first compartment in spaced apart relation via a hub so as to leave a gap between the first compartment and the second compartment with the first upper side of the first compartment facing the lower side of the second compartment, wherein the computing device enclosure is adapted to facilitate thermally coupling the heat exchanger to the liquid cooling device via at least one liquid supply line and at least one liquid discharge line.

24. The method of claim 23, comprising positioning the computing device in the first compartment and a fan in the second compartment, the fan having a hub region and a blade region, the fan being positioned so that the hub region is substantially aligned with the hub.

25. The method of claim 23, wherein the hub includes an internal bore, the method comprising routing the at least one liquid supply line and at least one liquid discharge line through the internal bore.

26. The method of claim 23, wherein the air inlet comprise plural openings positioned around the hub.

27. The method of claim 26, wherein the air outlet comprises plural openings spanning at least a portion of the second upper side.

28. The method of claim 23, wherein the hub comprises a first half coupled to the first compartment and a second half coupled to the first half and to the second compartment.

29. The method of claim 23, further comprising:
 positioning the liquid cooling device and the at least one heat generating component in the first compartment with the liquid cooling device in thermal contact with the at least one heat generating component; and
 positioning the heat exchanger in the second compartment and in fluid communication with the liquid cooling device and being operable to exchange heat with air moving from the air inlet through the second compartment to the air outlet.

30. The method of claim 29, wherein the liquid cooling device includes:
 a first surface adapted to thermally contact a first heat generating component of the computing device; and
 a second surface adapted to thermally contact a second heat generating component of the computing device,
 wherein the second surface opposes the first surface of the liquid cooling device.

31. The method of claim 29, wherein the liquid cooling device comprises a first cooling plate and a second cooling plate in fluid communication with the first cooling plate so that the internal chamber is divided between the first cooling plate and the second cooling plate.

32. A method of thermally managing a computing device having a heat generating component, comprising:
 placing the heat generating component in a first compartment of an enclosure formed by the first compartment, a second compartment and a hub connecting the first compartment to the second compartment, the first compartment having a first upper side, the second compartment having a second upper side including an air outlet and a lower side including an air inlet, the second compartment being connected in spaced apart relation to the first compartment by the hub so as to leave a gap between the first compartment and the second compartment with the first upper side of the first compartment facing the lower side of the second compartment;
 placing a liquid cooling device in the first compartment and in thermal contact with the first heat generating component;
 placing a heat exchanger in the second compartment; and
 thermally coupling the heat exchanger to the liquid cooling device via at least one liquid supply line and at least one liquid discharge line.

33. The method of claim 23, wherein the first upper side of the first compartment is without air flow passages to limit preheating from the first compartment of airflow entering the air inlet of the second compartment.

* * * * *